United States Patent [19]

Eichmann et al.

[11] Patent Number: 5,403,629
[45] Date of Patent: Apr. 4, 1995

[54] FORMATION OF INTERLAYERS FOR APPLICATION OF ALUMINUM DIFFUSION COATINGS

[75] Inventors: Wolfgang Eichmann, Puchhheim; Horst Pillhöfer, Röhrooms; Martin Thoma, Munich; Peter Adam, Dachau, all of Germany

[73] Assignee: Mtu Motoren-Und Turbinen-Union München GmbH, Munich, Germany

[21] Appl. No.: 60,419

[22] Filed: May 11, 1993

[30] Foreign Application Priority Data

May 13, 1992 [DE] Germany .................. 42 15 664.5

[51] Int. Cl.⁶ .................. B05D 3/06; C23C 14/00
[52] U.S. Cl. .................. 427/576; 204/192.16; 427/250; 427/255.7; 427/404
[58] Field of Search .................. 427/576, 250, 255.7, 427/404; 204/192.16

[56] References Cited

U.S. PATENT DOCUMENTS 4,935,193  6/1990  Grunke et al. .................. 427/12
4,944,858  7/1990  Murphy et al. .................. 204/192.15

FOREIGN PATENT DOCUMENTS 1545305  5/1979  United Kingdom.

*Primary Examiner*—Bernard Pianalto
*Attorney, Agent, or Firm*—Ladas & Parry

[57] ABSTRACT

A process for vapor depositing a metallic interlayer on the surface of a metal component, for example, by sputtering and thereafter depositing an aluminum diffusion coating on the interlayer. The metallic interlayer is vapor deposited on the surface of the component in a noble gas atmosphere, more than one-half of which, in per cent by weight, is composed of noble gases which are heavier than argon. Advantageously, the noble gases can be krypton or xenon. The process can be used with particular advantage for applying protective aluminum diffusion coatings on turbine blades.

10 Claims, 1 Drawing Sheet

FORMATION OF INTERLAYERS FOR APPLICATION OF ALUMINUM DIFFUSION COATINGS

FIELD OF THE INVENTION

The invention relates to improvements in a process for depositing metallic interlayers by sputter techniques on the surface of a metal component for subsequent application of protective aluminum diffusion coatings thereon.

BACKGROUND

In order to improve the corrosion resistance to hot gases of metal components, such as turbine blades, it is known to vapor deposit or electrodeposit onto the components a metallic interlayer prior to application on the component of an aluminum diffusion coating.

The electrodeposition of an interlayer has disadvantages which are inherent in the process. For example, the thickness of the interlayer can not be maintained within small tolerances and accordingly uniform, thickness of the interlayers can not be achieved.

Interlayers produced by sputtering (cathodic disintegration) have the disadvantages of producing microscopic defects and internal compressive stresses in the interlayers which impede an undisturbed subsequent application of the aluminum diffusion coating and when the coated component is subjected to thermal and/or oxidic stresses, pore formation is developed at the interface between the metallic interlayer and the aluminum diffusion coating.

SUMMARY OF THE INVENTION

An object of the invention is to provide a process of the above type in which internal stresses in the interlayer are reduced or completely eliminated enabling application of an undisturbed aluminum diffusion coating.

This object is achieved by the process according to the invention, in which a metallic interlayer is first sputter deposited onto the surface of the component under a noble gas atmosphere, more than one-half of which, in per cent by weight, is composed of noble gases which are heavier than argon, whereafter the aluminum diffusion coating is applied.

Extensive investigations have shown that the microscopic defects in a sputter deposited metallic interlayer are attributable to inclusions of atoms of the protective gas which are incorporated in the interlayer during the sputtering process. It has been possible to detect, in particular, argon atoms in a high concentration of up to 200 ppm in the sputter deposited metallic interlayer. Furthermore, compressive internal stresses of more than 400 MPa were detected by X-ray photography.

If the noble gas atmosphere comprises noble gases more than one-half of which, in per cent by weight, are heavier than argon, when the metallic interlayer is sputter deposited, the compressive internal stresses are eliminated completely and the concentration of argon atoms in the metallic interlayer is reduced to a value below the limit of detection of 1 ppm.

Furthermore, the adhesion of the subsequent aluminum diffusion coating is improved and a more uniform thickness of the aluminum diffusion coating is achieved.

In a preferred implementation of the process, the noble gas atmosphere is composed exclusively of noble gases heavier than argon. This has the advantage that, even if the coated component is exposed to high thermal stresses in an oxidizing hot-gas stream, no pore formation occurs at the interface between the metallic interlayer and the aluminum diffusion coating.

Preferably, krypton or xenon is used as the noble gas, because they have the advantage that, first of all, no argon is incorporated in the metallic interlayer and the compressive internal stresses are not only eliminated, but it has been possible to detect a minimum tensile internal stress in the metallic layer by X-ray photography, which subsequently had an advantageous effect on the growth rate of the aluminum diffusion coating.

In a further, preferred implementation of the process of the invention, metals of the platinum group, their alloys, hafnium or rare earths are sputter deposited as metals in the metallic interlayer. Noble metal interlayers of this type have the advantage that they provide a protective diffusion barrier for aluminum lattice atoms during aluminum diffusion coating. This has the advantageous result that the parent material is not embrittled by the aluminum diffusion and diffusion pores are not formed at the interface between the parent material and the coating, which pores hitherto caused peeling or partial peeling of the protective layer.

In a preferred implementation of the process, metallic interlayers having a thickness of up to 20 μm have proved particularly effective. If multi-layer protective layers composed of a platinum interlayer and an aluminum diffusion coating are used for turbine blades, their service life is advantageously increased and the inspection, maintenance and repair intervals for the turbines are prolonged.

Preferably, the deposit of the interlayer is effected by sputtering by means of cathodic disintegration or by ion coating by means of ion plasma. In the case of cathodic disintegration, higher-energy krypton or xenon ions produce denser metallic interlayers than conventional argon ions, and the krypton or xenon particles involved in the disintegration of the metallic cathode material produce an undisturbed build-up of the subsequent aluminum diffusion coating because of their adsorption or absorption property.

DETAILED DESCRIPTION OF PREFERRED EMBODIMENTS

Figure 1:
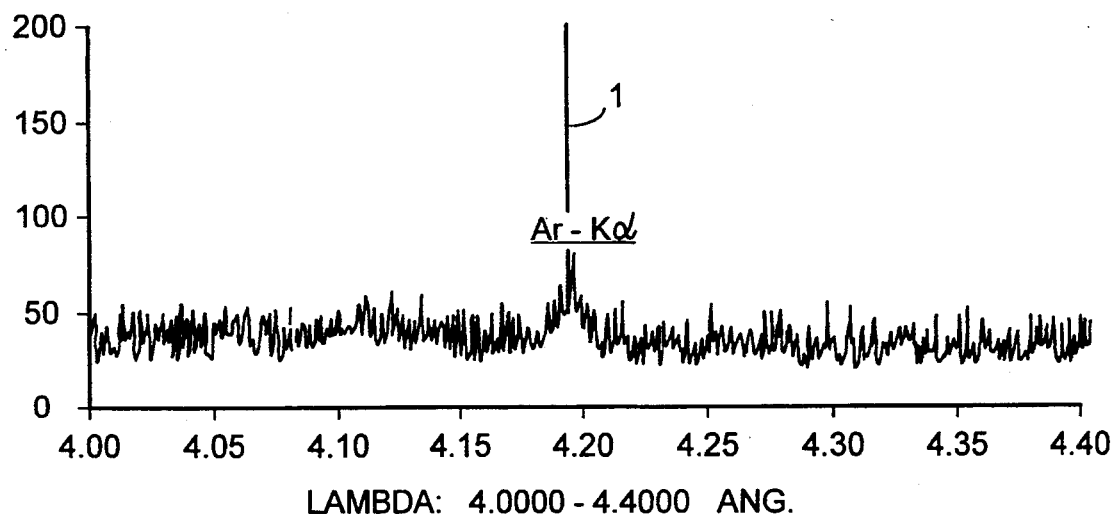
FIG. 1 shows the result of a microanalysis for the incorporation of argon as the noble gas in the formation of a platinum interlayer.

The invention will be described hereafter with reference to the drawing and the Example representing preferred embodiments.

EXAMPLE

The surface of a component, specifically an engine blade made of a cobalt based alloy is cleaned and placed in a sputtering chamber. The component is heated to a temperature of 150° to 700° C. and is subjected to a voltage of 50 to 200 V. A discharge voltage for cathodic disintegration is adjusted to a value of 200 to 1000 V and a sputtering power of 10 to 50 W/cm$^2$ is applied at a sputtering pressure of 0.1 to 5 Pa until a thickness of a vapor-deposited interlayer of 2 μm has been reached. An aluminum diffusion coating process is then carried out.

FIG. 1 shows a microanalysis result relating to the incorporation of argon as the noble gas in the formation of a platinum interlayer. The argon line 1, confirms that 200 ppm of argon were incorporated in the metallic interlayer of platinum. By X-ray photography, internal compressive stresses of over 400 MPa were measured in the interlayer.

Figure 2:
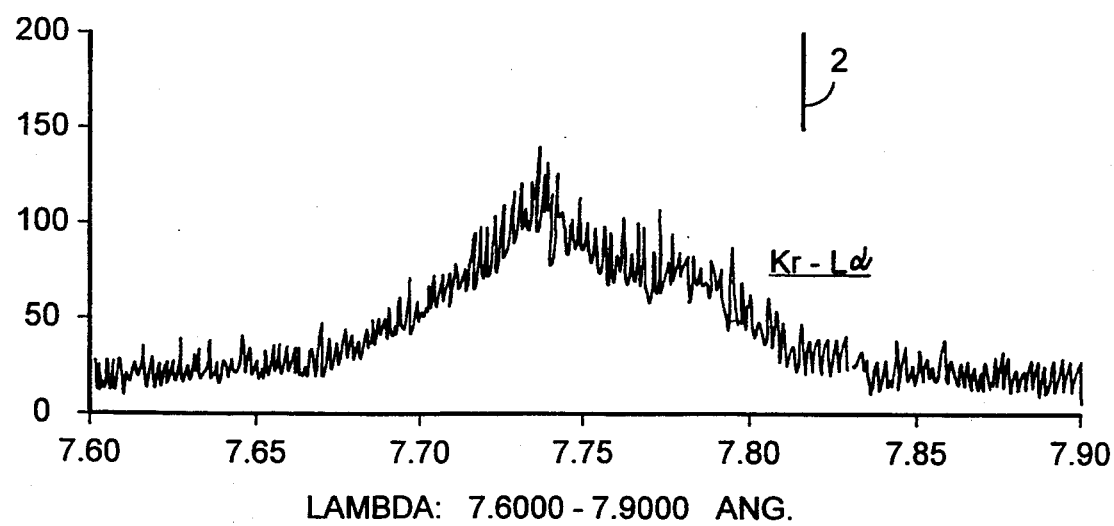
FIG. 2 shows the result of a microanalysis for the incorporation of krypton as the noble gas in the formation of a platinum interlayer.

FIG. 2 shows a microanalysis result relating to the incorporation of krypton as the noble gas in the formation of the platinum interlayer. The theoretical position 2 of the krypton line is denoted. Compared with FIG. 1, the incorporation of the noble gas in the metallic interlayer is almost nil. Furthermore, by X-ray photography, an internal tensile stress of less than 200 MPa was measured in the interlayer. Similar results can be obtained when xenon is the noble gas.

Although the invention has been described in conjunction with specific embodiments thereof it would be, apparent to those skill in the art that numerous modifications and variations can be made within the scope and spirit of the invention as defined in the attached claims.

What is claimed is:

1. A method of applying a protective coating on a metal component comprising vapor depositing a metal interlayer on a surface of a metal component, effecting said depositing in a noble gas atmosphere, more than one-half of which, in percent by weight, consists of noble gases heavier than argon and selected from the group consisting of krypton and xenon to produce said metal interlayer with a thickness of up to 20 μm and applying an aluminum diffusion coating on said metal interlayer.

2. A method as claimed in claim 1, wherein said noble gas atmosphere consists in entirety of said gases which are heavier then argon.

3. A method as claimed in claim 1, wherein said metal component is a turbine blade of an engine.

4. A method as claimed in claim 1, wherein the metal of said metal interlayer is selected from the group consisting of a metal of the platinum group, alloys thereof, hafnium, and rare earths.

5. A method as claimed in claim 1, wherein said vapor depositing of the metal interlayer is effected by sputter depositing by cathodic disintegration or by ion plasma depositing.

6. In a method of forming a protective coating on the surface of a metal component in which a metal interlayer is deposited onto the surface of the metal component and an aluminum diffusion coating is applied on said interlayer, the improvement comprising effecting the deposit of the interlayer on the surface of said component by vapor deposit in a gas atmosphere consisting of noble gases more than one-half of which, in per cent by weight, are heaver than argon and selected from the group consisting of krypton and xenon to produce said metal interlayer with a thickness of up to 20 μm.

7. The improvement as claimed in claim 6, wherein said metal component is a turbine blade of an engine.

8. The improvement as claimed in claim 6, wherein said vapor deposit of the metal interlayer is effected by sputter depositing by cathodic disintegration or by ion plasma depositing.

9. The improvement as claimed in claim 6, wherein the metal of said metal interlayer is selected from the group consisting of a metal of the platinum group, alloys thereof, hafnium, and rare earths.

10. The improvement as claimed in claim 9, wherein said noble gas atmosphere consists in entirety of said gases which are heavier than argon.

* * * * *